(12) United States Patent
Yang et al.

(10) Patent No.: US 8,982,601 B2
(45) Date of Patent: Mar. 17, 2015

(54) SWITCHABLE JUNCTION WITH AN INTRINSIC DIODE FORMED WITH A VOLTAGE DEPENDENT RESISTOR

(75) Inventors: Jianhua Yang, Palo Alto, CA (US); John Paul Strachan, Stanford, CA (US); Julien Borghetti, Mountain View, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 643 days.

(21) Appl. No.: 13/259,183

(22) PCT Filed: Sep. 4, 2009

(86) PCT No.: PCT/US2009/056061
§ 371 (c)(1),
(2), (4) Date: Sep. 23, 2011

(87) PCT Pub. No.: WO2011/028210
PCT Pub. Date: Mar. 10, 2011

(65) Prior Publication Data
US 2012/0063197 A1  Mar. 15, 2012

(51) Int. Cl.
*G11C 13/02* (2006.01)
*H01L 45/00* (2006.01)
*H01L 27/102* (2006.01)
*G11C 13/00* (2006.01)
*H01L 27/24* (2006.01)
(Continued)

(52) U.S. Cl.
CPC ........ *H01L 27/1021* (2013.01); *G11C 13/0007* (2013.01); *G11C 2213/12* (2013.01); *G11C 2213/32* (2013.01); *G11C 2213/34* (2013.01); *G11C 2213/72* (2013.01); *H01L 27/24* (2013.01); *H01L 29/8615* (2013.01); *H01L 29/872* (2013.01)
USPC ........................ 365/148; 257/4; 257/E45.003

(58) Field of Classification Search
CPC ............. G11C 13/002; G11C 13/0009; G11C 13/0011; H01L 45/06; H01L 45/08; H01L 45/085
USPC ............ 365/148; 257/2, 4, E45.001–E45.003
See application file for complete search history.

(56) References Cited

U.S. PATENT DOCUMENTS 7,417,271 B2 *   8/2008   Genrikh et al. ............... 257/289
7,569,459 B2 *   8/2009   Karg et al. .................... 438/385
2007/0165434 A1  7/2007   Lee et al.
(Continued)

FOREIGN PATENT DOCUMENTS

CN          101409303 A       4/2009

OTHER PUBLICATIONS

ISA 220 ISR & Written Opinion, May 20, 2010.

*Primary Examiner* — Allison P Bernstein
(74) *Attorney, Agent, or Firm* — Hewlett-Packard Patent Department

(57) ABSTRACT

A switchable junction (600) having an intrinsic diode (634) formed with a voltage dependent resistor (640) is disclosed. The switchable junction comprises a first electrode (618), a second electrode (622), and a memristive matrix (620) configured to form an electrical interface (626) with the first electrode (618). The electrical interface has a programmable conductance. The voltage dependent resistor (640) is in electrical contact with the memristive matrix (620). The voltage dependent resistor is configured to form a rectifying diode interface (628) with the second electrode (622).

19 Claims, 6 Drawing Sheets

(51) Int. Cl.
*H01L 29/861* (2006.01)
*H01L 29/872* (2006.01)

(56) References Cited

U.S. PATENT DOCUMENTS

| | | |
|---|---|---|
| 2008/0001172 A1 | 1/2008 | Karg et al. |
| 2008/0078985 A1* | 4/2008 | Meyer et al. ............ 257/6 |
| 2008/0079029 A1 | 4/2008 | Williams |
| 2008/0089110 A1* | 4/2008 | Robinett et al. ............ 365/148 |
| 2008/0090337 A1 | 4/2008 | Williams |
| 2008/0232154 A1 | 9/2008 | Kinoshita |
| 2008/0239797 A1 | 10/2008 | Tsukamoto et al. |
| 2008/0265235 A1 | 10/2008 | Kamigaichi et al. |
| 2009/0020745 A1* | 1/2009 | Jeong et al. ............ 257/4 |
| 2009/0137112 A1* | 5/2009 | Tabata et al. ............ 438/631 |
| 2009/0186443 A1* | 7/2009 | Joseph et al. ............ 438/104 |

* cited by examiner

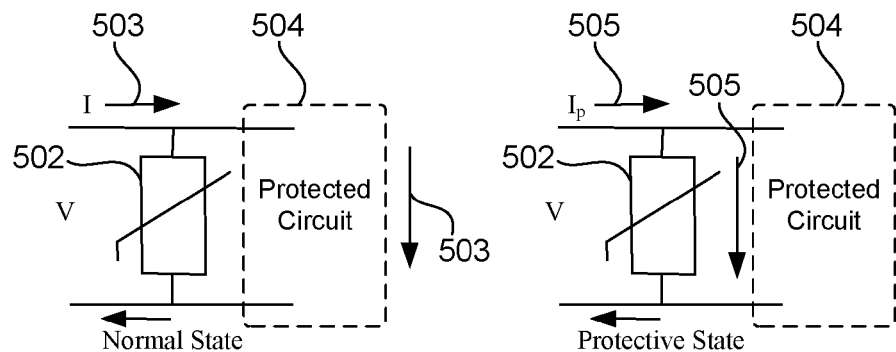
FIG. 5A  FIG. 5B
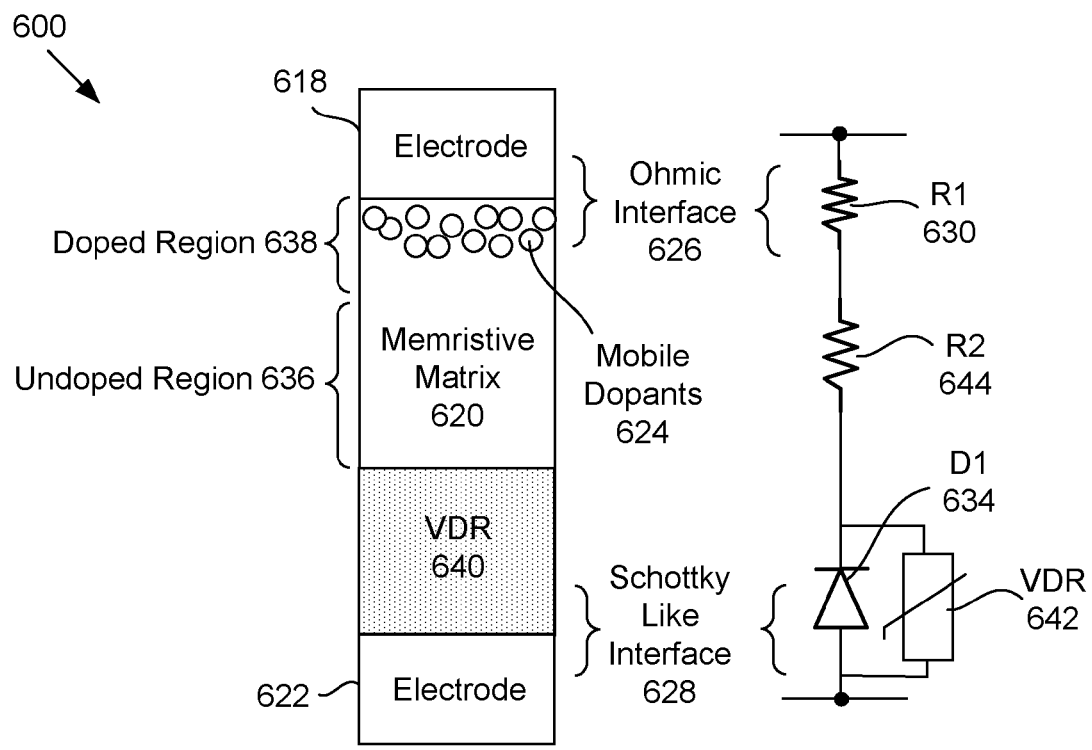
FIG. 6

SWITCHABLE JUNCTION WITH AN INTRINSIC DIODE FORMED WITH A VOLTAGE DEPENDENT RESISTOR

BACKGROUND

Nanoscale electronics promise a number of advantages including significantly reduced features sizes and the potential for self-assembly and for other relatively inexpensive, non-photolithography-based fabrication methods. Nanowire crossbar arrays can be used to form a variety of electronic circuits and devices, including ultra-high density nonvolatile memory. Junction elements can be interposed between nanowires at intersections where two nanowires overlay each other. These junction elements can be programmed to maintain two or more conduction states. For example, the junction elements may have a first low resistance state and a second higher resistance state. Data can be encoded into these junction elements by selectively setting the state of the junction elements within the nanowire array. Increasing the robustness and stability of the junction elements can yield significant operational and manufacturing advantages.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIGS. 5A and 5B are diagrams of a voltage dependent resistor placed in parallel with a circuit to protect the circuit from voltage spikes;

FIG. 6 is a diagram of an illustrative embodiment of a switchable junction element having a voltage dependent resistor according to one embodiment of principles described herein.

Reference will now be made to the exemplary embodiments illustrated, and specific language will be used herein to describe the same. It will nevertheless be understood that no limitation of the scope of the invention is thereby intended.

DETAILED DESCRIPTION

Nanoscale electronics promise a number of advantages including significantly reduced features sizes and the use of other relatively inexpensive, non-photolithography-based fabrication methods. One type of nanoscale device is a crossbar architecture. Studies of switching in nanometer-scale crossed-wire devices have previously reported that these devices could be reversibly switched and may have an "on-to-off" conductance ratio of ~$10^3$. These devices have been used to construct crossbar circuits and provide a route for the creation of ultra-high density nonvolatile memory. Additionally, the versatility of the crossbar architecture lends itself to the creation of other communication and logic circuitry. For example, logic families may be constructed entirely from crossbar arrays of switches or from hybrid structures composed of switches and transistors. These devices may increase the computing efficiency of CMOS circuits. These crossbar circuits may replace CMOS circuits in some circumstances and enable performance improvements of orders of magnitude without having to further shrink transistors.

The design and manufacture of nanoscale electronic devices presents a number of challenges which are being addressed to improve commercial production of nanoscale electronic devices and incorporate these devices into microscale and larger-scale systems, devices, and products.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout the specification, a conventional notation for the flow of electrical current is used. Specifically, the direction of a flow of positive charges ("holes") is from the positive side of a power source to the more negative side of the power source.

Figure 1:
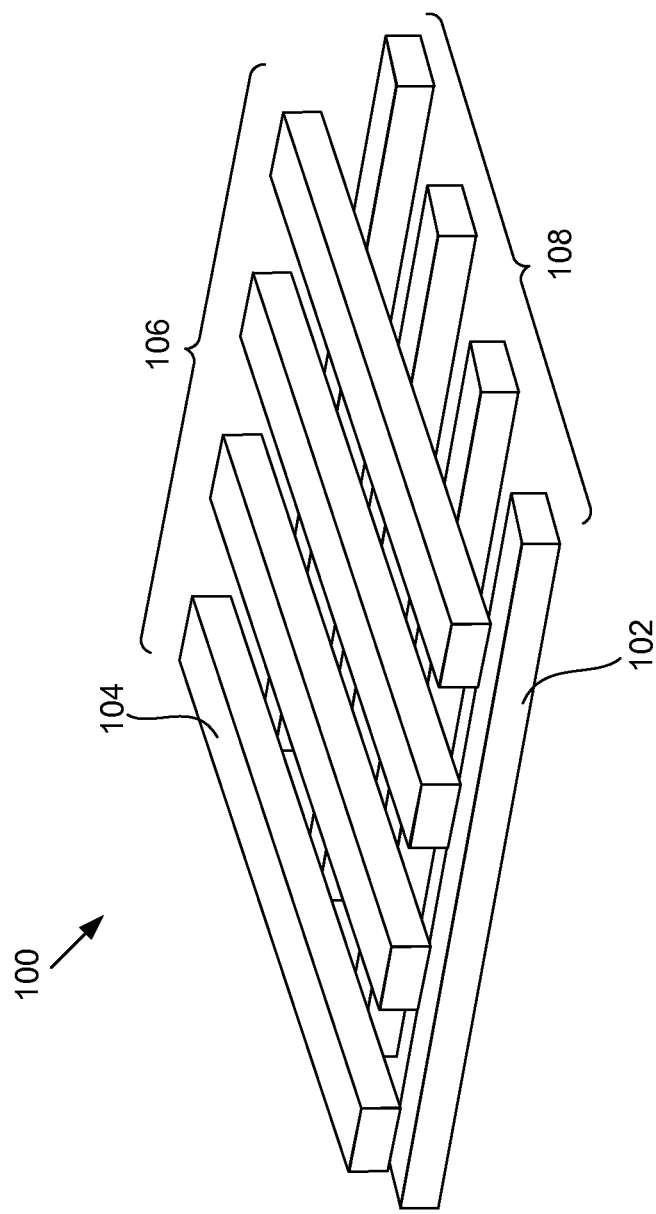
FIG. 1 is a perspective view of one illustrative embodiment of a nanowire crossbar architecture.

FIG. 1 is an isometric view of an illustrative nanowire crossbar array (100). The crossbar array (100) is composed of a first layer of approximately parallel nanowires (108) that are overlaid by a second layer of approximately parallel nanowires (106). The nanowires of the second layer (106) are roughly perpendicular, in orientation, to the nanowires of the first layer (108), although the orientation angle between the layers may vary. The two layers of nanowires form a lattice, or crossbar, each nanowire of the second layer (106) overlying all of the nanowires of the first layer (108) and coming into close contact with each nanowire of the first layer (108) at nanowire intersections that represent the closest contact between two nanowires.

Although individual nanowires (102, 104) in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of submicroscale wires, microscale wires, or wires with larger dimensions, in addition to nanowires.

The layers may be fabricated using a variety of techniques including conventional photolithography as well as mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semi conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

At nanowire intersections, nanoscale electronic components, such as resistors, and other familiar basic electronic components, can be fabricated to interconnect two overlapping nanowires. Any two nanowires connected by a switch is called a "crossbar junction."

Figure 2:
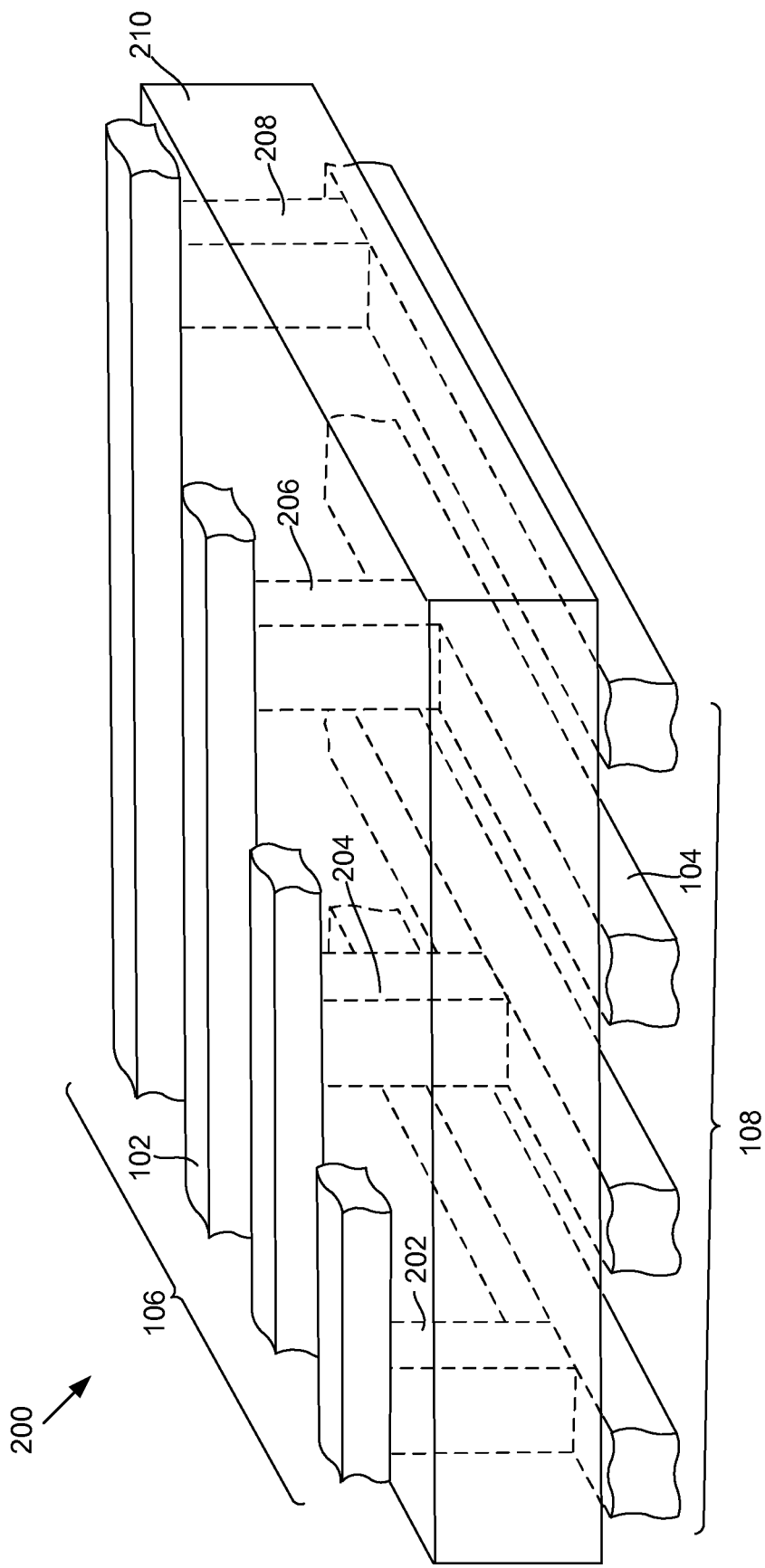
FIG. 2 is an isometric view of a nanowire crossbar architecture incorporating junction elements, according to one embodiment of principles described herein.

FIG. 2 shows an isometric view of an illustrative nanowire crossbar architecture (200) revealing an intermediate layer (210) disposed between a first layer of approximately parallel nanowires (108) and a second layer of approximately parallel nanowires (106). According to one illustrative embodiment, the intermediate layer (210) may be a dielectric layer. A number of junction elements (202-208) are formed in the intermediate layer at the wire intersection between wires in the top layer (106) and wires in the bottom layer (108). These junction elements (202-208) may perform a variety of functions including providing programmable switching between the nanowires. For purposes of illustration, only a few of the junction elements (202-208) are shown in FIG. 2. As discussed above, it can be desirable in many devices for a junction element to be present at each nanowire intersection. Because every wire in the first layer of nanowires (108) intersects each wire in the second layer of nanowires (106), placing a junction element at each intersection allows for any nanowire in the first layer (108) to be connected to any wire in the second layer (106).

According to one illustrative embodiment, the nanowire crossbar architecture (200) may be used to form a nonvolatile memory array. Each of the junction elements (202-208) may be used to represent one or more bits of data. For example, in the simplest case, a junction element may have two states: a conductive state and a nonconductive state. The conductive state may represent a binary "1" and the nonconductive state may represent a binary "0", or visa versa. Binary data can be written into the crossbar architecture (200) by changing the conductive state of the junction elements. The binary data can then be retrieved by sensing the state of the junction elements (202-208). The ability to change the conductive state of the junction elements is described in further detail below.

The example above is only one illustrative embodiment of the nanowire crossbar architecture (200). A variety of other configurations could be used. For example, the crossbar architecture (200) can incorporate junction elements which have more than two states. In another example, crossbar architecture can be used to form implication logic structures and crossbar based adaptive circuits such as artificial neural networks.

Figure 3A:
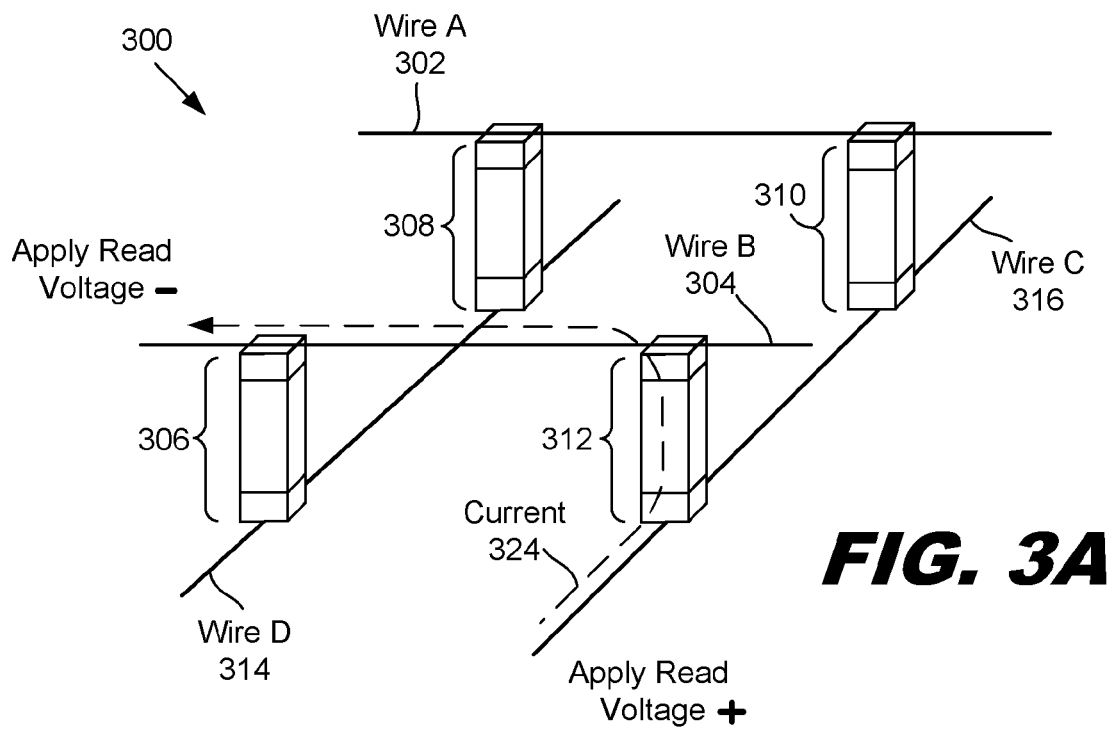
FIGS. 3A and 3B are illustrative diagrams which show current paths through a portion of a crossbar memory array, according to one embodiment of principles described herein.

FIG. 3A is diagram which shows an illustrative crossbar architecture (300). For purposes of illustration, only a portion of the crossbar architecture (300) has been shown and the nanowires (302, 304, 314, 316) have been shown as lines. Nanowires A and B (302, 304) are in an upper layer of nanowires and nanowires C and D (314, 316) are in a lower layer and nanowires. Junctions (306-312) connect the various nanowires at their intersections.

According to one illustrative embodiment, the state of a junction (312) between wire B (304) and wire C (316) can be read by applying a negative (or ground) read voltage to wire B (304) and a positive voltage to wire C (316). Ideally, if a current (324) flows through the junction (312) when the read voltages are applied, the reading circuitry can ascertain that the junction (312) is in its conductive state. If no current, or an insubstantial current, flows through the junction (312), the reading circuitry can ascertain that the junction (312) is in its resistive state.

However, if the junctions (306-310) are purely resistive in nature (i.e. a relatively low resistance is a conductive state and a relatively high resistance is a resistive state) a number of leakage currents can also travel through other paths. These leakage currents can be thought of as "electrical noise" which obscures the desired reading of the junction (312)

Figure 3B:
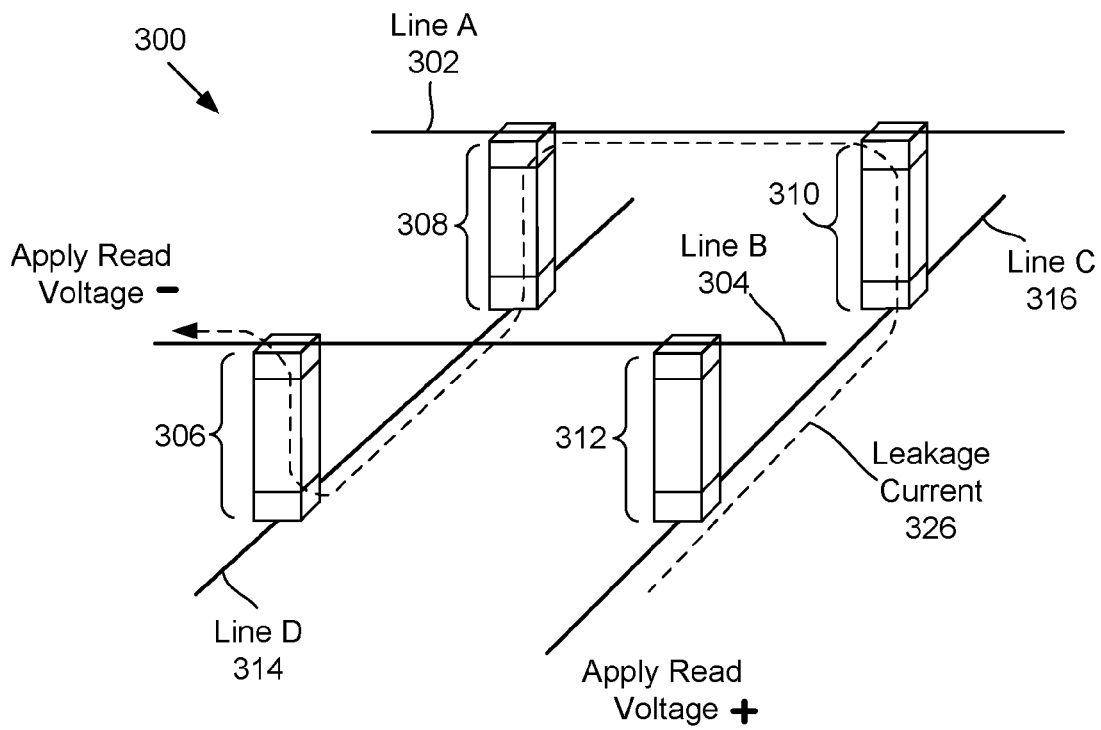

FIG. 3B shows a leakage current (326) which travels through an alternative path between wire C (316) and wire B (304). In FIG. 3B, the leakage current (326) travels through three junctions (310, 308, 306) and is present on line B (304). As can be imagined, in an array of greater size than that illustrated in FIG. 3B, various leakage currents can travel through a large number of alternative paths and be present on line B (304) when it is sensed by the reading circuitry. These leakage currents can produce a significant amount of undesirable current which obscures the desired reading of the state of the junction (312).

Figure 4A:
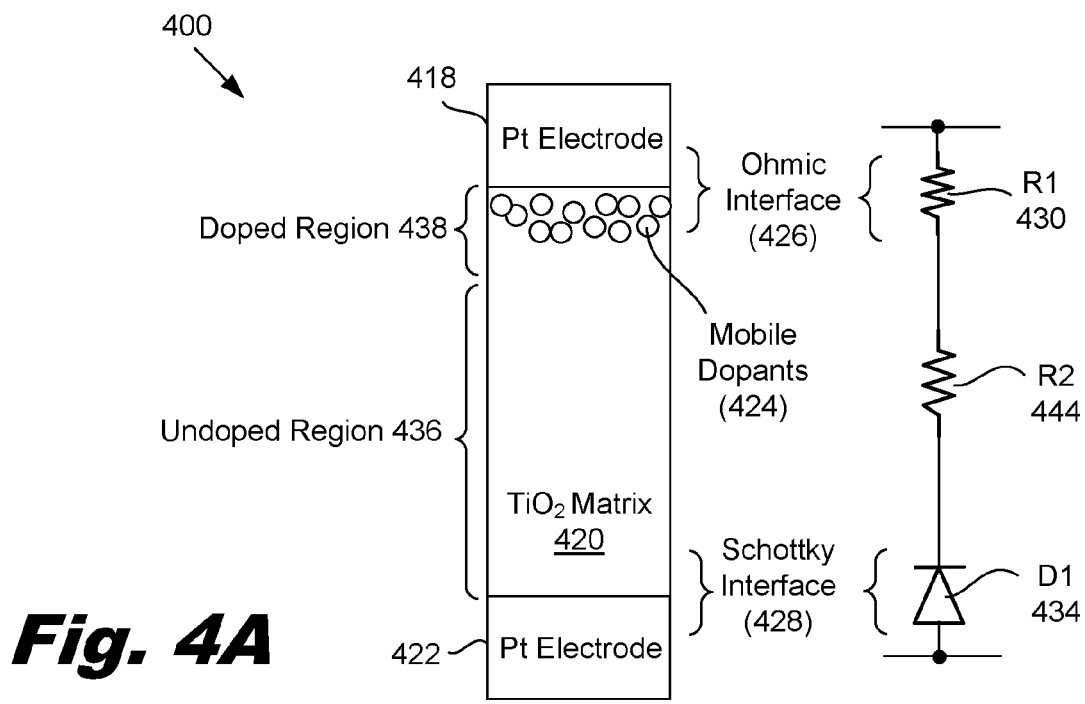
FIGS. 4A, 4B are diagrams of two operational states of an illustrative switchable junction element, according to one embodiment of principles described herein.
Figure 4B:
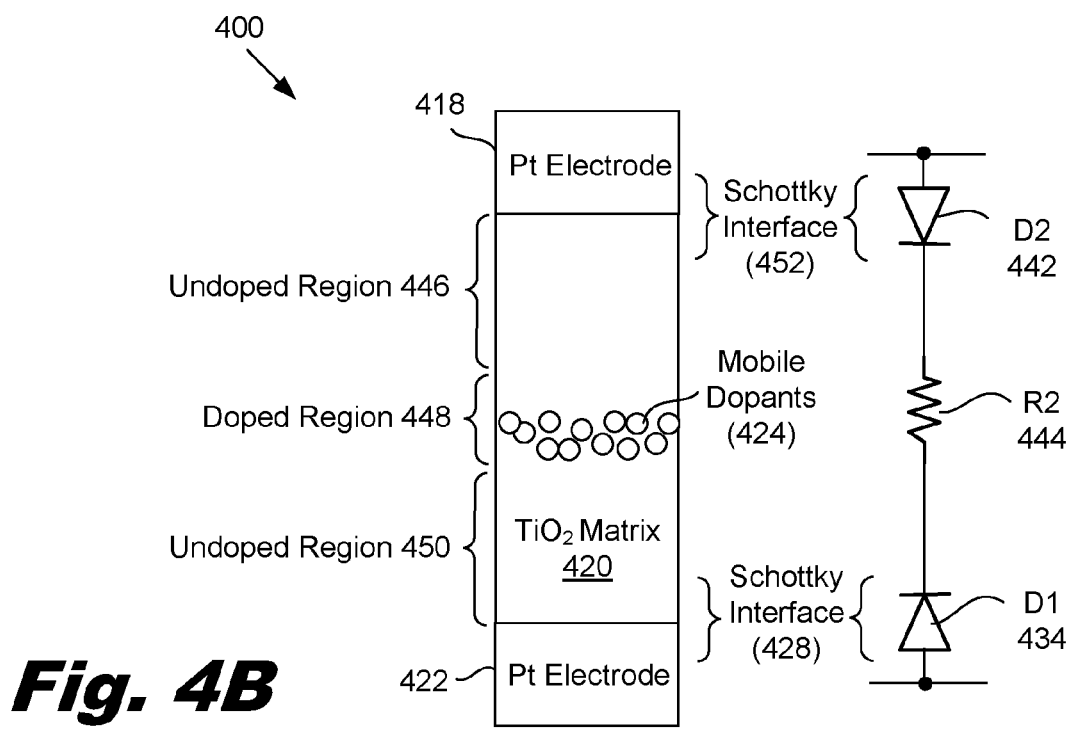

FIGS. 4A-4B are diagrams which show one illustrative embodiment of a switchable junction element (400) which can include diode-like behavior that reduces crosstalk. According to one illustrative embodiment, the junction element includes an upper platinum electrode (418) and a lower platinum electrode (422). Typically, the electrodes (418, 422) are the intersecting wires, but the electrodes may be separate elements which are electrically connected to the intersecting wires. The center portion of the junction element (400) may be made up of a memristive matrix material. A memristive matrix material is a semiconducting material that contains a number of mobile dopants. Under the influence of a relatively high programming voltage (i.e. >1 MV/cm), the mobile dopants are moved through the semiconducting material, thereby changing properties of the junction. The mobile dopants remain in position when a lower reading voltage is applied, allowing the state of the junction to remain stable until another programming voltage is applied.

A number of different types of matrix/dopant combinations can be used to form a memristive matrix. Table 1, below lists a number of illustrative materials and dopants which may be used.

TABLE 1

Illustrative List of Doped Materials, Undoped Materials, and Mobile Dopants

| Undoped | Doped | Mobile Dopant |
| --- | --- | --- |
| TiO2 | TiO2-x | Oxygen vacancies |
| ZrO2 | ZrO2-x | Oxygen vacancies |
| HfO2 | HfO2-x | Oxygen vacancies |
| TaO | $TaO_{1-x}$ | Oxygen vacancies |
| VaO | $VaO_{1-x}$ | Oxygen vacancies |
| MbO | $MbO_{1-x}$ | Oxygen vacancies |
| SrTiO3 | SrTiO3-x | Oxygen vacancies |
| GaN | GaN1-x | Nitrogen vacancies |
| CuCl | CuCl1-x | Chlorine vacancies |
| GaN | GaN:S | Sulfide ions |

To successfully construct a junction element with the desired rectifying behavior a number of factors can be considered, including: the band gap of the semiconductor matrix, the type and concentration of dopants in the semiconductor, the electrode metal's work function, and other factors, as can be appreciated.

Other types of illustrative conductive materials that can be used as electrodes to interface with the memristive matrix include gold, silver, aluminum, copper, platinum, palladium, ruthenium, rhodium, osmium, tungsten, molybdenum, tantalum, niobium, cobalt, nickel, iron, chromium, vanadium, titanium, iridium, iridium oxide, ruthenium oxide, titanium nitride, titanium carbide, tantalum nitride and tantalum carbide. Various types of alloys, composites, and conductive polymers may also be used as electrodes. The material used to form the electrode is selected to form an electrode/memristive matrix interface that provides a desired range of switching voltages that enable mobile dopants within the memristive matrix to be moved sufficient to change the impedance of the interface region.

According to one illustrative embodiment, the memristive matrix may be a titanium dioxide ($TiO_2$) matrix (420) and the mobile dopants (424) may be oxygen vacancies within the titanium dioxide matrix (420). The oxygen vacancy dopants (424) are positively charged and will be attracted to negative voltages and repelled by positive voltages. Consequently, by applying a negative programming voltage to the upper electrode (418) and a positive programming voltage to the bottom electrode (422), an electric field of sufficient intensity to move the dopants (424) upward can be achieved. An electric field of this intensity will not be present within other junctions of a nanowire array because there is only one junction where the wires connected to the upper electrode and lower electrode intersect, namely at the junction (400). As a result, each of the junctions within a nanowire array can be individually programmed to have a variable resistance, modeled as a resistor (444). The mobile dopants (424) drift upward and form a doped region (438) next to the interface between the memristive matrix (420) and the upper electrode (418). The movement of these mobile dopants from the lower regions of the matrix (420) creates a relatively lightly doped region, referred to as an undoped region (436).

Throughout the specification, drawings, and appended claims, the terms "doped region" and "undoped region" are used to indicate comparative levels of dopants or other impurities which may be present in a material. For example, the term "undoped" does not indicate the total absence of impurities or dopants, but indicates that there are significantly less impurities than in a "doped region." The titanium dioxide matrix (420) is a semiconductor which exhibits significantly higher conductivities in doped regions and lower conductivities in undoped regions.

The high electrical conductivity of the upper electrode (418) and the relatively high electrical conductivity in the doped region (438) create a relatively good match in electrical properties at the interface. Consequently, there is a smooth electrical transition between the two materials. This electrical transition between the upper electrode (418) and the matrix (420) is called an Ohmic interface (426). The Ohmic interface (426) is characterized by relatively high electrical conductivity.

To the right of the physical diagram of the junction element (400), a corresponding electrical diagram is shown. The Ohmic interface (426) is modeled as a resistor R1 (430). As discussed above, the resistor R1 (430) will have a relatively low resistance due to the low resistance across the interface.

At the interface between the matrix (420) and the lower electrode (422), the conductive metal electrode (422) directly interfaces with the undoped region (436) of the titanium dioxide matrix. At this interface, there is a relatively large difference in the electrical conductivity and other properties of the adjoining materials. The electrical behavior at this interface is significantly different than the Ohmic interface (426). Instead of an ohmic interface, the lower interface forms a Schottky-like interface (428). A Schottky interface (428) has a potential barrier formed at a metal-semiconductor interface which has diode-like rectifying characteristics. Schottky interfaces are different than a p-n interface in that they have a much smaller depletion width in the metal.

In one embodiment, the switchable junction element (400) may be created using multiple thin films to form the various layers. In multilayer thin films, the interface behavior may not be exactly the same as a traditional Schottky barrier. Consequently, various interfaces between the illustrative thin films are described as "Schottky-like." The corresponding electrical element is modeled as a diode D1 (434). At moderate voltages, the diode D1 (434) allows electrical current to flow in only one direction. In the illustrative embodiment shown in FIG. 4A, the diode D1 (434) only allows current to flow from the lower electrode (422) to the upper electrode (418). By incorporating this diode behavior into each of the junction elements in the crossbar array, a large portion of the cross talk currents can be blocked. In one embodiment, the device state shown in FIG. 4A can be called the ON state.

The advantages of this diode behavior can be better understood by returning to FIGS. 3A and 3B. In one embodiment, each of the junction elements (306-312) incorporates this diode behavior. Consequently, current can flow from the lower wires (314, 316) to the upper wires (302, 304) but cannot flow the opposite direction. The reading current of FIG. 3A is not impeded because the flow of the current is upward from wire C (316) to wire B (304). However, the leakage current (326) shown in FIG. 3B is blocked as the leakage current attempts to travel downward through the junction element (308) between line A (302) and line D (314). Other leakage paths within the nanowire array are similarly blocked as they attempt to pass from nanowires in the upper layer of the array to nanowires in the lower layer.

However, the diode behavior breaks down when higher reverse voltages are applied across the junction elements. Diodes and diode-like interfaces have a characteristic reverse voltage at which the barrier to the flow of current breaks down. This characteristic reverse voltage is called the dielectric breakdown voltage. After the dielectric breakdown voltage is exceeded, the interface can become permanently conductive and current can flow relatively unimpeded through the barrier. In some embodiments, the interface may alternatively be changed by the application of a high reverse voltage such it has a very high electrical resistance. The term "breakdown voltage" as used in the specification and appended claims refers to irreversible chemical changes at an interface rather than reversible breakdown mechanisms such as those used in avalanche or Zener diodes. The dielectric breakdown may occur in both reverse current direction (as described above) and in the forward direction. A dielectric breakdown in the forward direction may occur when the electric field is relatively small, but the current and heating are great enough to chemically alter the interface.

FIG. 4B illustrates the switchable junction element (400) in a second state. In one embodiment, this state can be referred to as the OFF state. In the ideal case, the bottom interface remains a rectifying diode-like interface to block the cross talk currents and the mobile dopants (424) can be moved away from the top electrode (418) through the application of an appropriate voltage. For example where the mobile dopants (424) are oxygen vacancies, applying a positive voltage to the top electrode (418), a negative voltage to the bottom electrode (422), or a combination of both can produce a motion of the positively charged oxygen vacancies downward toward the center of the matrix (420). This creates an upper undoped region (446), a central doped region (448), and a lower undoped region (450). The upper interface then becomes an upper Schottky like interface (452) which is created by the direct electrical contact between the undoped upper region (446) and the metal electrode (418).

The electrical model of the junction is shown to the right of the cross-sectional diagram. The upper diode D2 (442) and the lower diode D1 (434) are in a head-to-head configuration which prevents any substantial current from flowing through the junction (400). The lower diode D1 (434) prevents the downward flow of electrical current and the upper diode D2 (442) prevent the upward flow of electrical current. The resistance R2 (444) represents residual electrical resistances, such as interface resistances and the resistances of materials which make up the interface (418).

The junction state illustrated in FIG. 4B is a nonconductive state. When a reading voltage is applied to the junction no substantial amount of current will pass through the junction. Consequently, by altering the location of the mobile dopants (424), the state of the junction (400) can be altered. The mobile dopants (424) remain in substantially the same distribution until a programming voltage is applied which creates an electric field sufficient to cause motion of the mobile dopants (424).

In some circumstances, a programming voltage which is applied to induce the motion of the mobile dopants within the memristive matrix may approach a diode breakdown voltage. High programming voltages move the mobile dopants quickly and repeatably into the desired position. For example, the mobility of the dopants within the memristive matrix may be exponentially dependent on the applied voltage. When high programming voltages (>1 MV/cm) are applied, the dopant motion of some dopant species can be extremely rapid and repeatable. Consequently, it can be desirable to use high programming voltages to achieve fast write times and accurate junction states.

However, if the programming voltage approaches the dielectric breakdown at a specific interface, the Schottky-like barriers in one or more of the interfaces may breakdown, allowing a surge of current to pass through the junction and nanowires. This can be undesirable for several reasons. First, the excess flow of current increases the power consumption of the device. Second, the surge of current can induce heating in the junctions or nanowires which generates heat. This heat can damage one or more of the components within the nanowire array. For example, the heat may cause chemical changes in the wires or matrix which undesirably alter their properties. Higher heats may cause one or more of the components to melt, creating an electrical short. Consequently, the desire for higher programming voltages can be balanced against the possibility of breaking down the diode-like interfaces within the switchable junction elements.

According to one illustrative embodiment, adding a layer of material to form a voltage dependent resistor (VDR) between one of the electrodes and the memristive matrix material can be advantageous in creating a stable diode interface. The properties of the VDR can reduce the voltage drop across the interface, thereby reducing or eliminating the chance of a diode breakdown voltage occurring. This allows the use of the desired programming voltages and rapid writing of data to a crossbar memory array.

A VDR is an electronic component with a significant non-ohmic current-voltage characteristic. The most common type of VDR is a Metal Oxide Varistor (MOV). The MOV device contains a ceramic mass of oxide grains, such as zinc oxide, in a matrix of other metal oxides. The metal oxides can include small amounts of bismuth, cobalt, and manganese. The various components are typically sandwiched between two metal plates (the electrodes). The boundary between each grain and its neighbor forms a diode junction, which allows current to flow in only one direction. A mass of randomly oriented grains is electrically equivalent to a network of back-to-back diode pairs. Each pair can be considered to be in parallel with many other pairs. When a small or moderate voltage is applied across the electrodes, only a tiny current flows. This small current is caused by a reverse leakage through the network of diode junctions. When a large voltage is applied across the electrodes, the diode junction temporarily breaks down due to a combination of thermionic emissions and electron tunneling, thereby creating a relatively large current that flows through the VDR. The result of this behavior is a highly nonlinear current-voltage characteristic, in which the VDR has a high resistance at low voltages and a low resistance at high voltages.

VDRs are typically used to protect circuits against excessive transient voltages by placing the VDR in parallel with the circuit that the VDR is used to protect. For example, FIGS. 5a and 5b show a VDR (502) placed in parallel with a circuit (504) that is protected from transient voltage spikes by the VDR. When the voltage is relatively low, the high resistance of the VDR (502) directs the current (503) to flow past the VDR (502) and through the circuit (504), as shown in FIG. 5A. However, when a higher voltage, such as an excessive transient voltage is applied, the resistance of the VDR (502) is significantly decreased. The relatively low resistance of the VDR (502) causes the current (505) to be directed through the VDR (502), as shown in FIG. 5B. This enables the circuit (504) to be protected from transient voltage spikes that may otherwise damage sensitive components in the protected circuit (504).

FIG. 6 is a diagram of one illustrative embodiment of a switchable junction device (600) which has an intrinsic Schottky like interface (628) formed with a VDR (640). The VDR (640) is used to reduce the voltage drop across the interface during a write operation when the device is in the "on" state. When the switchable junction device (600) is in the "on" state, the mobile dopants (624) in the doped region (638) are located proximate the electrode (618). This forms an ohmic interface (626) represented by the resistor (630). The resistance of the ohmic interface is relatively low, with a range on the order of tens of Ohms to hundreds of kilohms. The actual amount of resistance of the ohmic interface is dependent on the thickness of the layers in the switchable junction elements. Nano-sized devices (less than 1 micrometer) have a resistance on the lower end of the range, while micro-sized and larger devices can have a resistance on the upper end of the range. The voltage drop across the ohmic interface is therefore relatively small. However, at the other end of the switchable junction device (600), the Schottky like interface (628) that is created between the undoped region (636) and the electrode (622) can have a much greater resistance, on the range of a hundreds of kilohms to a gigaohm. This causes a much greater voltage drop across the interface (628). This voltage drop may be sufficient at switching voltages to cause damage to the interface through reverse voltage breakdown of the Schottky like interface (628).

To reduce the risk of a reverse voltage breakdown of the Schottky like interface (628), a VDR (640) can be implemented between the first (618) and second (622) electrodes. The VDR is modeled by the symbol (642) in the corresponding electrical diagram. The VDR (642) is electrically modeled to be in parallel with the diode (634) representing the Schottky-like diode interface. The resistor R2 (644) represents the resistance of the undoped region (636), and the resistance R1 (630), represents the resistance of the ohmic interface (626).

In the example embodiment illustrated in FIG. 6, the VDR (640) is located between the memristive matrix (620) and the second electrode (622). At a relatively high voltage, such as the switching voltage of the switchable junction device (600) (e.g. >2V), the resistance of the VDR (640) significantly decreases. This enables most of the voltage drop to occur across the interface between the electrode (618) and the memristive matrix (620), allowing the switchable junction device (600) to switch.

When a switching voltage is applied across the switchable junction device (600), the resistance of the VDR (640) is significantly decreased, but is still in the range of tens of Ohms to hundreds of kilohms, as previously discussed. The voltage drop that does occur across the VDR (640) at the switching voltage reduces the voltage drop across the Schottky like interface (628), thereby protecting the interface from damage caused by an excessive voltage drop across the interface when a switching voltage is applied.

At lower voltages, such as a read voltage (e.g. <0.5V), the resistance of the VDR (640) is relatively high, thereby forming the Schottky like interface (628) between the electrode 622 and the VDR 640, and minimizing leakage current and crosstalk.

The use of a VDR (640) in a switchable junction device (600) also acts to increase the overall resistance of the device in both the read voltage and the write voltage phases, relative to a switchable junction device that does not include a VDR. This increased resistance reduces the amount of current flowing through the junction during read and write operations, thereby decreasing the amount of power consumed in a nanowire crossbar architecture, such as the example architecture (200) shown in FIG. 2.

The polarity of the switching voltage is determined based on the charge of the mobile dopants (624). A polarity is selected to create an electric field within the memristive matrix that drives the dopants towards the first electrode (618) to form an "ON" state of the switchable junction element (600). An opposite polarity is selected to move the switchable junction element (600) to the "OFF" state. Intuitively, the state selected as "on" and "off" can be chosen arbitrarily, or based upon the needs of a larger system.

The state of the switchable junction element (600) can be read by applying a voltage that is less than the switching voltage. The Schottky-like diode interface (628) significantly limits leakage current and crosstalk from occurring during both the read and write cycles. The VDR (640) also adds significant additional resistance during the read cycle, further limiting the current flow during read operations.

Figure 7:
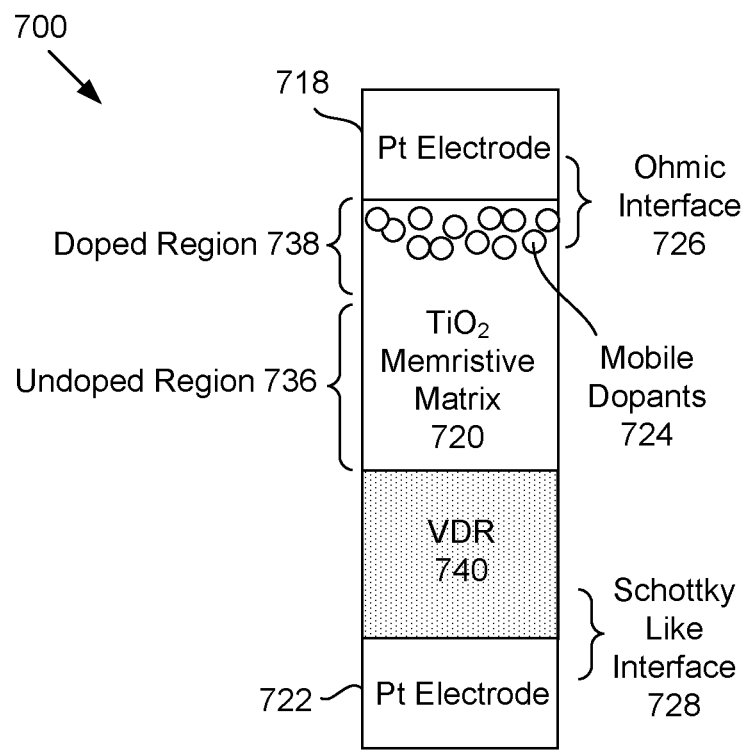
FIG. 7 is a diagram of another illustrative embodiment of a switchable junction element having a voltage dependent resistor, according to a embodiment of principles described herein.

In another example embodiment, illustrated in FIG. 7, a switchable junction device (700) can be formed with a first electrode (718), a memristive matrix (720), and a second electrode (722). The electrodes can be formed of a conductive material having a desired switching voltage relative to the memristive matrix (720) material. In this example, platinum is used to form the electrodes. The memristive matrix (720) can be formed of a selected material, as previously discussed. In this example, a titanium dioxide material can be used to form the memristive matrix. The switching voltage between the platinum electrode (718) and the titanium dioxide matrix (720) is approximately 1.5 volts. As previously discussed, a negative voltage can be used to cause the mobile dopants (724) to migrate towards the first electrode (718), switching the switchable junction device to an "on" state and forming an ohmic interface (726) between the first electrode (718) and the TiO$_2$ memristive matrix (720). A negative voltage can be applied between the electrodes to cause the mobile dopants (724) to migrate away from the first electrode (718), switching the switchable junction device to an "off" state. The resistance of the interface (726) in the "ON" state is on the order of $10^2$ to $10^4$, or about $10^3$ times less than the resistance in the "OFF" state. This large change in resistance can be sensed by applying the reading voltage, as discussed above.

The voltage drop across the Schottky-like diode interface (728) is reduced by the VDR (740), which is electrically connected in a parallel connection with the diode, as previously discussed. The VDR becomes conductive at the applied switching voltage. This enables a majority of the applied voltage to be used for switching that may otherwise cause a problem with reverse voltage breakdown across the interface (728). The switching voltage enables the mobile dopants (724) to migrate at a higher rate of speed through the memristive matrix (720), thereby enabling the switchable junction device to be switched at a higher rate of speed.

In addition, the VDR acts to reduce current flow through the switchable junction element during both the read and write cycles. This enables the switchable junction element to be used in a large array, such as a nanowire crossbar architecture. The VDR can significantly reduce physical defects that may occur in such an array caused by diode breakdown. The reduced current flowing through the array can reduce the amount of power needed to read and write digital information, thereby increasing the ability to use a large array of switchable junction elements in an architecture such as the nanowire crossbar architecture. The reduced power consumption can enable efficient use of the element array in battery operated devices.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A switchable junction element having an intrinsic diode formed with a voltage dependent resistor, comprising:
    a first electrode:
    a second electrode;
    a memristive matrix comprising a semiconducting material containing mobile dopants, the memristive matrix being configured to form an electrical interface with the first electrode, the electrical interface having a programmable conductance in which the electrical interface is an ohmic interface when the mobile dopants are migrated towards the first electrode and the electrical interface is a Schottky interface when the mobile dopants are migrated away from the first electrode; and
    the voltage dependent resistor (VDR) in electrical contact with the memristive matrix, the voltage dependent resistor being configured to form a rectifying diode interface with the second electrode.

2. The switchable junction element according to claim 1, wherein the first and second electrodes are formed from a material selected from the group consisting of gold, silver, aluminum, copper, platinum, palladium, ruthenium, rhodium, osmium, tungsten, molybdenum, tantalum, niobium, cobalt, nickel, iron, chromium, vanadium, titanium, iridium, iridium oxide, ruthenium oxide, titanium nitride, titanium carbide, tantalum nitride and tantalum carbide.

3. The switchable junction element according to claim 1, wherein the memristive matrix is formed from a material selected from the group consisting of titanium dioxide, zirconium dioxide, hafnium dioxide, tantalum oxide, vanadium oxide, molybdenum oxide, strontium titanium trioxide, gallium nitride, and copper chloride.

4. The switchable junction element according to claim 1, wherein the mobile dopants are selected from the group consisting of oxygen vacancies, nitrogen vacancies, chlorine vacancies, and sulfide ions.

5. The switchable junction element according to claim 1, wherein a resistance of the VDR decreases as the voltage across the VDR increases.

6. The switchable junction element according to claim 1, wherein a voltage drop across the VDR decreases a voltage drop across the rectifying diode interface with the second electrode when a write voltage is applied across the first and second electrodes.

7. The switchable junction element according to claim 1, further comprising a plurality of the switchable junction elements aligned to form a cross bar array.

8. The switchable junction element according to claim 1, in which the switchable junction element is configured to form a switchable electrical connection between two nanowires in a crossbar array.

9. The switchable junction element according to claim 1, wherein the mobile dopants are configured to be moved through the memristive matrix by an application of a programming voltage across the first and second electrodes; wherein a mobile dopants distribution is configured to define the programmable conductance of the electrical interface.

10. The switchable junction element according to claim 1, wherein the VDR reduces a current flow through the switchable junction element when one of a switching voltage and a reading voltage is applied across the first and second electrodes.

11. The switchable junction element according to claim 1, wherein the memristive matrix is formed from a material selected from the group consisting of titanium dioxide, zirconium dioxide, hafnium dioxide, tantalum oxide, vanadium oxide, molybdenum oxide, strontium titanium trioxide, gallium nitride, and copper chloride; and the mobile dopants are selected from the group consisting of oxygen vacancies, nitrogen vacancies, chlorine vacancies, and sulfide ions.

12. The switchable junction element according to claim 11, wherein the memristive matrix is formed from titanium dioxide and the mobile dopants are oxygen vacancies.

13. A switchable junction element having an intrinsic diode formed with a voltage dependent resistor, comprising:
a first electrode;
a second electrode;
a memristive matrix having mobile dopants;
a first electrical interface between the memristive matrix and the first electrode operable to form a first rectifying diode interface in which the first electrical interface is an ohmic interface when the mobile dopants are migrated towards the first electrode and the first electrical interface is a Schottky interface when the mobile dopants are migrated away from the first electrode;
wherein the voltage dependent resistor is in electrical contact with the memristive matrix;
a second electrical interface formed between the voltage dependent resistor and the second electrode, that is operable to form a second rectifying diode interface; and
wherein a voltage drop across the voltage dependent resistor reduces a voltage drop across the second electrical interface when a switching voltage is applied between the first and second electrodes.

14. The switchable junction element according to claim 13, wherein the voltage dependent resistor reduces a current flow through the switchable junction element when one of a read voltage and a switching voltage is applied between the first and second electrodes.

15. The switchable junction element according to claim 13, wherein a resistance of the VDR decreases as a voltage across the VDR increases.

16. The switchable junction element according to claim 13, in which the switchable junction is configured to form a switchable electrical connection between two nanowires in a crossbar array.

17. The switchable junction element according to claim 13, wherein the mobile dopants are configured to be moved through the memristive matrix by the application of a programming voltage across the first and second electrodes; the mobile dopants distribution being configured to define the programmable conductance of the electrical interface.

18. The switchable junction element according to claim 13, wherein the memristive matrix is formed from a material selected from the group consisting of titanium dioxide, zirconium dioxide, hafnium dioxide, tantalum oxide, vanadium oxide, molybdenum oxide, strontium titanium trioxide, gallium nitride, and copper chloride; and the mobile dopants are selected from the group consisting of oxygen vacancies, nitrogen vacancies, chlorine vacancies, and sulfide ions.

19. The switchable junction element according to claim 18, wherein the memristive matrix is formed from titanium dioxide and the mobile dopants are oxygen vacancies.

* * * * *